US009543954B2

(12) United States Patent
Wu et al.

(10) Patent No.: US 9,543,954 B2
(45) Date of Patent: Jan. 10, 2017

(54) DRIVER CIRCUIT WITH DEVICE VARIATION COMPENSATION AND OPERATION METHOD THEREOF

(71) Applicant: Industrial Technology Research Institute, Hsinchu (TW)

(72) Inventors: Chi-Liang Wu, Taoyuan County (TW); Ya-Hsiang Tai, Hsinchu (TW); Yung-Hui Yeh, Hsinchu (TW); Zong-Hua Cai, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 50 days.

(21) Appl. No.: 14/592,910

(22) Filed: Jan. 9, 2015

(65) Prior Publication Data

US 2016/0112046 A1 Apr. 21, 2016

(30) Foreign Application Priority Data

Oct. 21, 2014 (TW) .............................. 103136281 A

(51) Int. Cl.
 *H03K 3/00* (2006.01)
 *H03K 19/0185* (2006.01)

(52) U.S. Cl.
 CPC ............................ *H03K 19/018507* (2013.01)

(58) Field of Classification Search
 None
 See application file for complete search history.

(56) References Cited

U.S. PATENT DOCUMENTS

| 5,222,082 A | 6/1993 | Plus | |
|---|---|---|---|
| 5,703,825 A * | 12/1997 | Akiba | H03K 17/161 365/168 |
| 7,113,430 B2 * | 9/2006 | Hoefler | G11C 8/08 365/185.18 |
| 7,116,594 B2 * | 10/2006 | Luk | G11C 7/06 327/51 |
| 7,212,462 B1 * | 5/2007 | Tuan | G11C 11/413 365/154 |

(Continued)

FOREIGN PATENT DOCUMENTS

| CN | 101964175 | 2/2011 |
|---|---|---|
| TW | 200417975 | 9/2004 |
| TW | 201239846 | 10/2012 |

OTHER PUBLICATIONS

Seung-Hwan Moon, et al., "46.1: Invited Paper: Integrated a-Si:H TFT Gate Driver Circuits on Large Area TFT-LCDs," SID Symposium Digest of Technical Papers, vol. 38, Issue 1, May 2007, pp. 1478-1481.

(Continued)

*Primary Examiner* — Khareem E Almo
(74) *Attorney, Agent, or Firm* — Jianq Chyun IP Office

(57) ABSTRACT

A driver circuit with device variation compensation function and an operation method thereof are provided. The driver circuit includes a pull-up switch unit, an isolating switch and a pull-down switch unit. A first terminal of the pull-up switch unit is coupled to a first voltage. A second terminal of the pull-up switch unit is coupled to an output terminal of the driver circuit. A first terminal of the isolating switch is coupled to the second terminal of the pull-up switch unit. A first terminal of the pull-down switch unit is coupled to a second terminal of the isolating switch. A second terminal of the pull-down switch unit is coupled to a second voltage. The pull-down switch unit has a device variation compensation function.

20 Claims, 10 Drawing Sheets

(56) References Cited

U.S. PATENT DOCUMENTS

| | | | | |
|---|---|---|---|---|
| 7,728,649 | B1* | 6/2010 | Webb | H03K 17/165 327/404 |
| 8,410,816 | B1* | 4/2013 | Liu | H03K 19/018521 326/68 |
| 8,487,922 | B2 | 7/2013 | Brown et al. | |
| 8,581,825 | B2 | 11/2013 | Jang et al. | |
| 2006/0139292 | A1 | 6/2006 | Yoon et al. | |
| 2010/0188385 | A1 | 7/2010 | Boiko | |
| 2010/0194448 | A1 | 8/2010 | Lee | |
| 2015/0303920 | A1* | 10/2015 | Friedman | H03K 19/018521 326/81 |

OTHER PUBLICATIONS

Susumu Edo, et al., "46.3: A 2.2" QVGA a-Si TFT LCD with High Reliability Integrated Gate Driver, SID Symposium Digest of Technical Papers, vol. 37, Issue 1, Jun. 2006, pp. 1551-1554.

Soo Young Yoon, et al., "P-172L: Late-News Poster: Highly Stable Integrated Gate Driver Circuit using a-Si TFT with Dual Pull-down Structure," SID Symposium Digest of Technical Papers, vol. 36, Issue 1, May 2005, pp. 348-351.

Mindoo Chun, et al., "Integrated Gate Driver Using Highly Stable a-Si TFT's," IDW/AD '05, 12th International Display Workshops in Conjunction with Asia Display, vol. 2, Dec. 2005, pp. 1077-1080.

Jae Won Choi, et al., "P-16: Distinguished Student Paper: Noble a-Si:H Gate Driver with High Stability," SID Symposium Digest of Technical Papers, vol. 39, Issue 1, May 2008, pp. 1227-1230.

Ja Hun Koo, et al., "Nobel a-Si:H Gate Drivers with High Reliability," IDW '06, Dec. 2006, pp. 757-760.

Zong-Hua Cai, et al., "Circuit of Gate Driver on Array with Direct Threshold Voltage Compensation for the Pull-Down Transistors," IDW '14, Dec. 2014, pp. 329-332.

"Office Action of Taiwan Counterpart Application", issued on Mar. 24, 2016, p. 1-p. 4.

* cited by examiner

DRIVER CIRCUIT WITH DEVICE VARIATION COMPENSATION AND OPERATION METHOD THEREOF

CROSS-REFERENCE TO RELATED APPLICATION

This application claims the priority benefit of Taiwan application serial no. 103136281, filed on Oct. 21, 2014. The entirety of the above-mentioned patent application is hereby incorporated by reference herein and made a part of this specification.

TECHNICAL FIELD

The present disclosure relates to a driver circuit with device variation compensation and an operation method thereof.

BACKGROUND

Generally, a gate driver circuit of a display panel uses a N-type thin film transistor (TFT). In order to ensure that a thin film transistor of a pixel on a scan line (a gate line) is continuously turned off, a gate driver circuit needs to maintain a voltage of the scan lines (a gate voltage of the thin film transistor) at a low level. In a gate driver circuit, a pull-down circuit for providing the low level needs to be continuously turned on, which results in a continuing bias voltage for the thin film transistor. Under the operating condition of the continuing bias voltage in high voltage, the thin film transistor may generate a characteristic variation (e.g., a characteristic degradation and/or a threshold voltage variation). The characteristic degradation of the thin film transistor may reduce a working life thereof, whereas a threshold voltage Vth variation of the gate driver circuit may affect a reliability of the gate driver circuit.

Take a push-pull output circuit for example, in the circumstance where a push-pull output signal of the driver circuit are to be maintained at a low logic level, a bias voltage of a pull-down transistor (e.g., a N-type transistor) of a pull-push output circuit in the driver circuit are maintained at a high logic level. Because the pull-down transistor for providing a low output level are continuously applied by high voltage, a characteristic variation (a characteristic degradation and/or a threshold voltage variation) may occur on a transistor characteristic thereof.

In order to solve aforesaid problem, a plurality of pull-down circuits/devices are utilized in some embodiments, so as to reduce a duty cycle of the pull-down circuits/devices. However, with extension of operating time, the threshold voltage variation may still occur on the pull-down circuits/devices. Furthermore, a process variation may occur during a manufacturing process of the driver circuit. The process variation may change a characteristic of the transistor (e.g., variation may occur on the threshold voltage of the transistor). It is an issue to be solved as how to improve the reliability of the driver circuit while effectively reducing influences caused by the device variation of the threshold voltage.

SUMMARY

A driver circuit and an operation method thereof are provided according to embodiments of the present disclosure, which are capable of compensating device variation of a threshold voltage.

An embodiment of the present disclosure provides a driver circuit, which includes a pull-up switch unit, an isolating switch and a pull-down switch unit. A first terminal of the pull-up switch unit is coupled to a first voltage. A second terminal of the pull-up switch unit is coupled to an output terminal of the driver circuit. A first terminal of the isolating switch is coupled to the second terminal of the pull-up switch unit. A first terminal of the pull-down switch unit is coupled to a second terminal of the isolating switch. A second terminal of the pull-down switch unit is coupled to a second voltage. When the driver circuit operates in an initialization mode, the isolating switch is turned off, and the pull-down switch unit samples a threshold voltage of the pull-down switch unit to obtain a pull-down threshold voltage value. When the driver circuit operates in a normal mode, the isolating switch is turned on, and the pull-down switch unit uses the pull-down threshold voltage value to compensate an input voltage of the pull-down switch unit.

An embodiment of the present disclosure provides an operation method of a driver circuit. Therein, the driver circuit includes a pull-up switch unit, an isolating switch and a pull-down switch unit. A first terminal and a second terminal of the pull-up switch unit are coupled to a first voltage and an output terminal of the driver circuit respectively. The first voltage is a first system voltage. A first terminal of the isolating switch is coupled to the second terminal of the pull-up switch unit. A first terminal and a second terminal of the pull-down switch unit are coupled to a second terminal of the isolating switch and a second voltage respectively. The second voltage is a second system voltage. The operation method includes: when the driver circuit operates in an initialization mode, turning off the isolating switch; when the driver circuit operates in the initialization mode, sampling a threshold voltage of the pull-down switch unit to obtain a pull-down threshold voltage values; when the driver circuit operates in a normal mode, turning on the isolating switch; and when the driver circuit operates in the normal mode, using the pull-down threshold voltage value to compensate an input voltage of the pull-down switch unit.

Based on the above, the driver circuit and the operation method thereof as described in the embodiments of the present disclosure are capable of utilizing the pull-down switch unit to sample the threshold voltage of the pull-down switch therein. When the driver circuit operates in the normal mode, the pull-down switch unit can compensate the input voltage of the pull-down switch unit according to the sampled pull-down threshold voltage value. Therefore, the driver circuit and the operation method as described in the embodiments of the present disclosure are capable of compensating the device variation of the threshold voltage.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
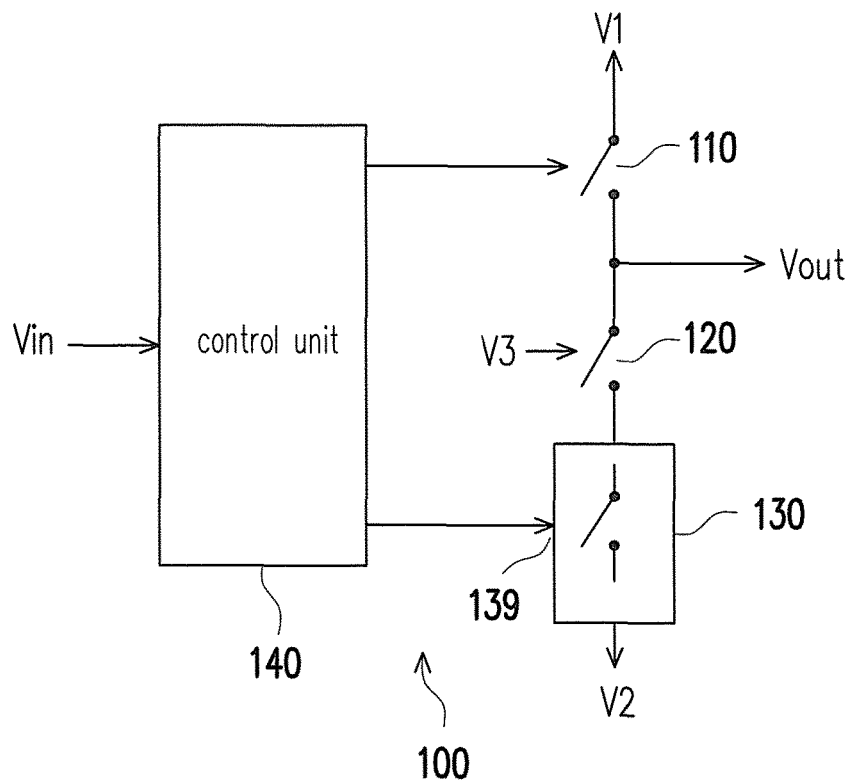
FIG. 1A is a block diagram illustrating circuitry of a driver circuit according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The term "coupling/coupled" used in this specification (including claims) may refer to any direct or indirect connection means. For example, "a first device is coupled to a second device" may be interpreted as "the first device is directly connected to the second device" or "the first device is indirectly connected to the second device through other devices or connection means." Moreover, wherever appropriate in the drawings and embodiments, elements/components/steps with the same reference numerals represent the same or similar parts. Elements/components/steps with the same reference numerals or names in different embodiments may be cross-referenced.

The following embodiments are provided for illustrating a driver circuit with device variation compensation function and an operation method thereof. The driver circuit is capable of directly compensating a device characteristic in order to compensate device variation of the threshold voltage of a pull-down switch (e.g., the thin film transistor or other switch devices). The driver circuit can include a threshold voltage compensation function in order to improve a reliability and an accuracy thereof.

FIG. 1A is a block diagram illustrating circuitry of a driver circuit 100 according to an embodiment of the present disclosure. The driver circuit 100 includes a pull-up switch unit 110, an isolating switch 120, a pull-down switch unit 130, and a control unit 140. A first terminal of the pull-up switch unit 110 is coupled to a first voltage V1. A second terminal of the pull-up switch unit 110 is coupled to an output terminal Vout of the driver circuit 100. A first terminal of the isolating switch 120 is coupled to the second terminal of the pull-up switch unit 110. A first terminal of the pull-down switch unit 130 is coupled to a second terminal of the isolating switch 120. A second terminal of the pull-down switch unit 130 is coupled to a second voltage V2. The first voltage V1 and the second voltage V2 may be a voltage of any level, and the first voltage V1 is greater than the second voltage V2. For example (yet the present disclosure is not limited thereto), the first voltage V1 may be a first system voltage (e.g., a system voltage Vdd or other voltages), and the second voltage V2 may be a second system voltage (e.g., a grounding voltage Vss or other voltages). In another embodiment, the first voltage V1 may be a clock signal, and the second voltage V2 may also be the second system voltage (e.g., the grounding voltage Vss or other voltages). In other embodiments, the second system voltage (the second voltage V2) may be any fixed voltage greater than 0V, the grounding voltage or a negative voltage.

The isolating switch 120 is controlled by a control voltage V3. When the driver circuit 100 operates in a normal mode, the isolating switch 120 is turned on. When the driver circuit 100 operates in an initialization mode, the isolating switch 120 is turned off.

The control unit 140 may be any input-stage circuit, such as a differential input pair, a shift register, a multiplexor or other input-stages. An input terminal of the control unit 140 is coupled to an input terminal Vin of the driver circuit 100. A first output terminal and a second output terminal of the control unit 140 are coupled to a control terminal of the pull-up switch unit 110 and a control terminal 139 of the pull-down switch unit 130 respectively. In the normal mode, the isolating switch 120 is turned on. According to a level of the input terminal Vin, the control unit 140 is capable of correspondingly controlling the pull-up switch unit 110 and the pull-down switch unit 130 for collectively generating a signal of the output terminal Vout in a manner of push-pull.

When the driver circuit 100 operates in the initialization mode, the pull-down switch unit 130 samples a threshold voltage Vth of the pull-down switch unit 130 to obtain a pull-down threshold voltage value. The driver circuit 100 may utilize the pull-down switch unit 130 to sample a threshold voltage of a pull-down switch therein. Accordingly, when the driver circuit 100 operates in the normal mode, the pull-down switch unit 130 can use the pull-down threshold voltage value to compensate an input voltage of the pull-down switch unit 130.

Figure 1B:
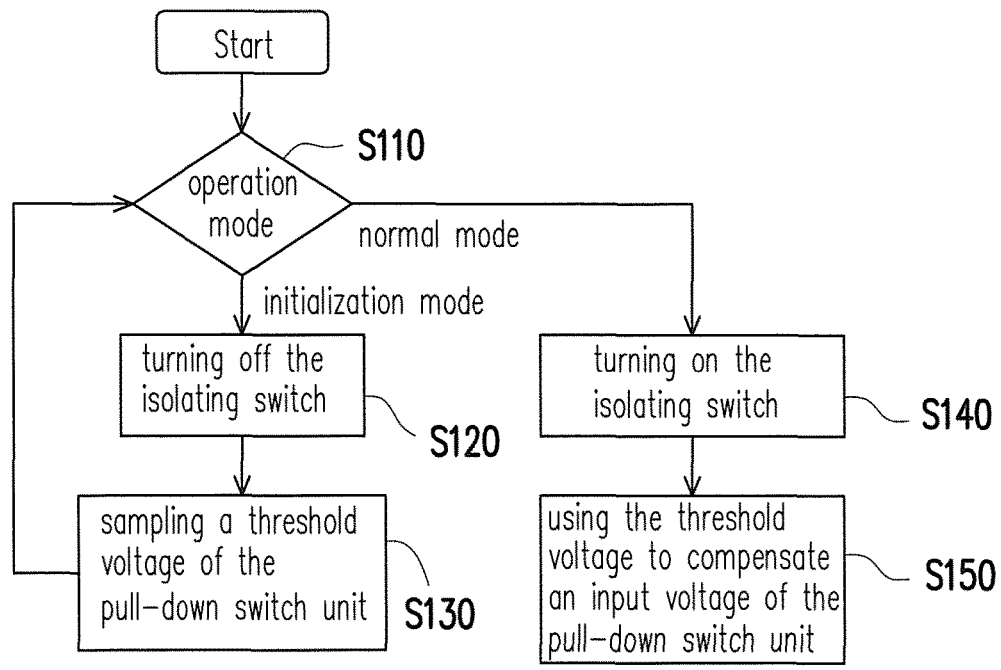
FIG. 1B is a flowchart illustrating an operation method of a driver circuit according to an embodiment of the present disclosure.

Herein, an operation method of the driver circuit 100 is described as follows. FIG. 1B is a flowchart illustrating an operation method of a driver circuit according to an embodiment of the present disclosure. In step S110, an operation mode of the driver circuit 100 may be determined. FIG. 1A and FIG. 1B may refer to each other. When it is determined that the driver circuit 100 operates in the initialization mode in step S110, the isolating switch 120 is turned off (step S120), and a threshold voltage of the pull-down switch unit 130 with the compensation function is sampled in order to obtain a first threshold voltage value (step S130). When it is determined that the driver circuit 100 operates in the normal mode in step S110, the isolating switch 120 is turned on (step S140), and the first threshold voltage value is used to compensate an input voltage of the pull-down switch unit 130 with the compensation function (step S150).

Figure 2:
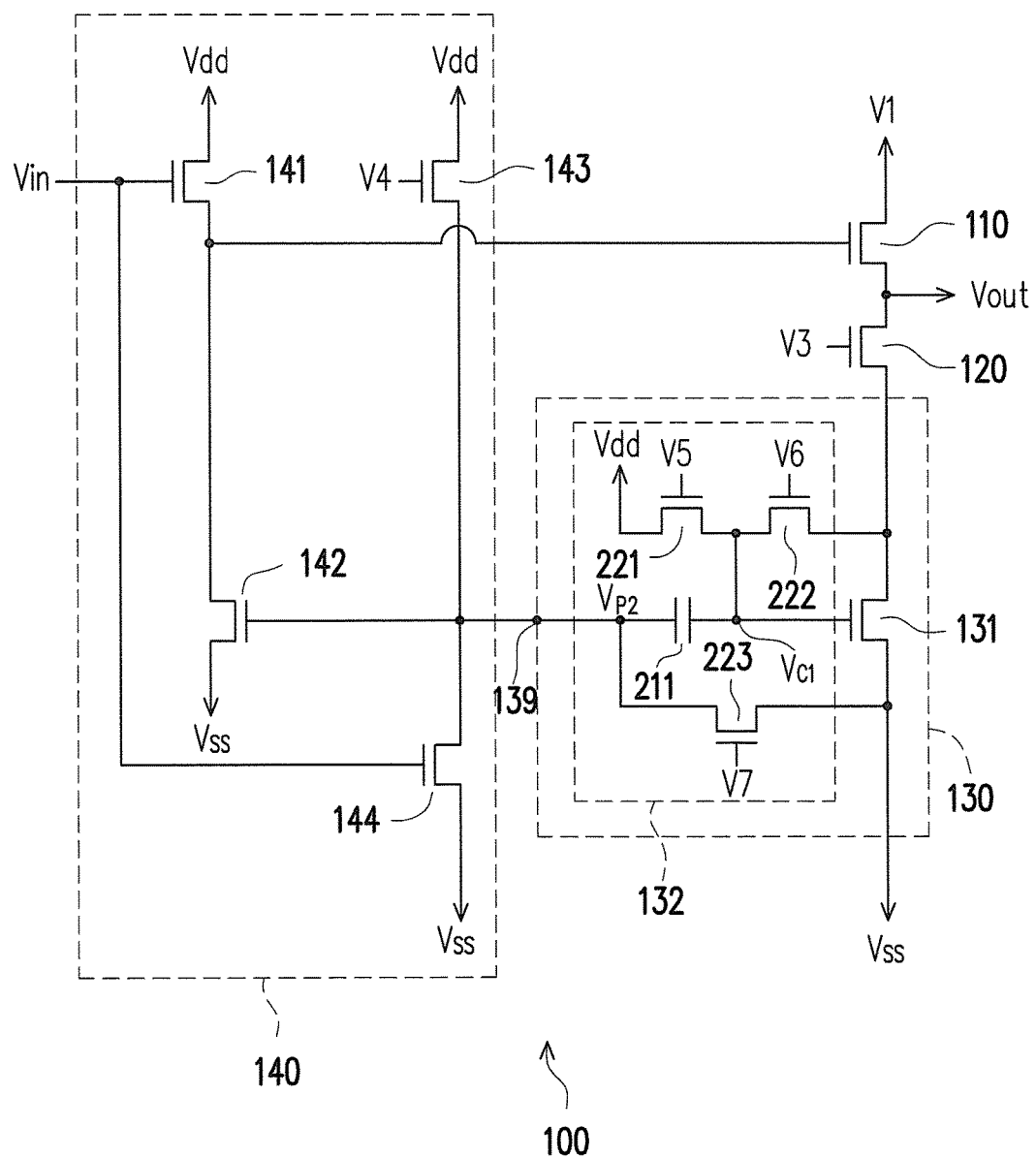
FIG. 2 is a block diagram illustrating circuitry of the driver circuit depicted in FIG. 1A according to an embodiment of the present disclosure.

FIG. 2 is a block diagram illustrating circuitry of the driver circuit 100 depicted in FIG. 1A according to an embodiment of the present disclosure. In the embodiment depicted in FIG. 2, the control unit 140 includes a first transistor 141, a second transistor 142, a third transistor 143 and a fourth transistor 144. A first terminal of the first transistor 141 is coupled to a third voltage (e.g., the first system voltage, such as the system voltage Vdd or other fixed voltages). A second terminal of the first transistor 141 is coupled to the control terminal of the pull-up switch unit 110. A control terminal of the first transistor 141 is coupled to the input terminal Vin of the driver circuit 100. A first terminal of the second transistor 142 is coupled to the second terminal of the first transistor 141. A second terminal of the second transistor 142 is coupled to the second voltage (e.g., the second system voltage, such as the grounding voltage Vss or other fixed voltages). A control terminal of the second transistor 142 is coupled to the control terminal 139 of the pull-down switch unit 130. A first terminal of the third transistor 143 is coupled to the third voltage (e.g., the system voltage Vdd). A second terminal of the third transistor 143 is coupled to the control terminal of the second transistor 142 and the control terminal 139 of the pull-down switch unit 130. A control terminal of the third transistor 143 is controlled by a voltage V4. The voltage V4 may be a clock signal or a bias voltage with a fixed level. A first terminal of the fourth transistor 144 is coupled to the second terminal of the third transistor 143. A second terminal of the fourth transistor 144 is coupled to the second voltage (e.g., the grounding voltage Vss). A control terminal of the fourth transistor 144 is coupled to the input terminal Vin of the driver circuit 100.

In the embodiment depicted in FIG. 2, the pull-down switch unit 130 includes a pull-down switch 131 and a pull-down switch compensating circuit 132. A first terminal of the pull-down switch 131 is coupled to the second terminal of the isolating switch 120. A second terminal of the pull-down switch 131 is coupled to the second voltage (e.g., the second system voltage, such as the grounding voltage Vss or other fixed voltages). The pull-down switch compensating circuit 132 is coupled between the control terminal 139 of the pull-down switch unit 130 and a control terminal of the pull-down switch 131. When the driver circuit 100 operates in the initialization mode (e.g., an initialization mode PI depicted in FIG. 3), the pull-down switch compensating circuit 132 can sample a threshold voltage Vth of the pull-down switch 131 to obtain the pull-down threshold voltage value. When the driver circuit 100 operates in the normal mode (e.g., a normal mode PN depicted in FIG. 3), the pull-down switch compensating circuit 132 uses the pull-down threshold voltage value to compensate an input voltage of the pull-down switch 131.

In the embodiment depicted in FIG. 2, the pull-down compensating circuit 132 includes a capacitor 211, a first switch 221, a second switch 222 and a third switch 223. A first terminal and a second terminal of the capacitor 211 are coupled to the control terminal 139 of the pull-down switch unit 130 and the control terminal of the pull-down switch 131 respectively. A first terminal and a second terminal of the first switch 221 are coupled to the third voltage (e.g., the system voltage Vdd) and the second terminal of the capacitor 211 respectively. A first terminal and a second terminal of the second switch 222 are coupled to the second terminal of the capacitor 211 and the first terminal of the pull-down switch 131 respectively. A first terminal and a second terminal of the third switch 223 are coupled to the first terminal of the capacitor 211 and the second terminal of the pull-down switch 131 respectively.

Figure 3:
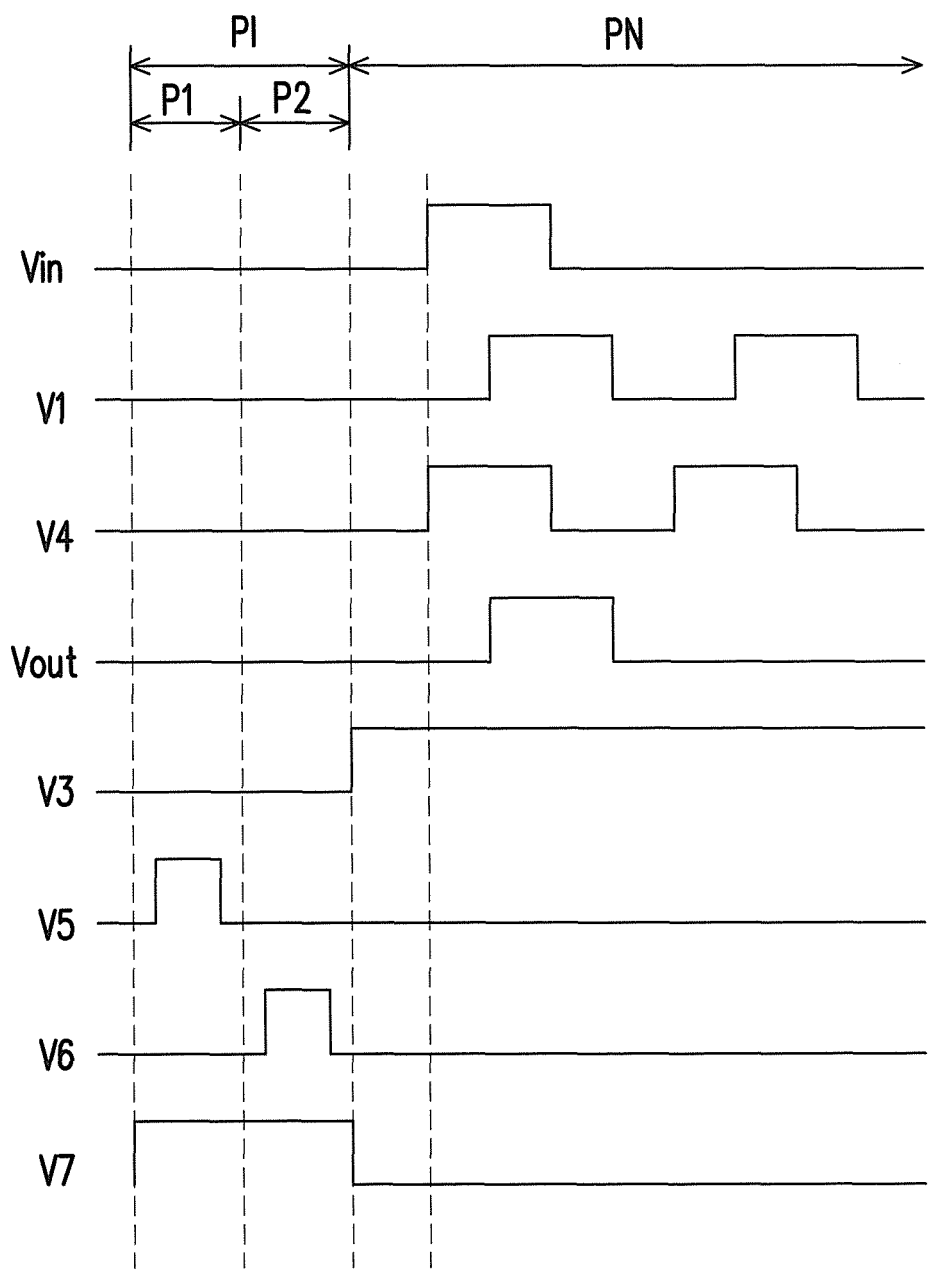
FIG. 3 is a schematic diagram illustrating a timing sequence of the control signal depicted in FIG. 2 according to an embodiment of the present disclosure.

FIG. 3 is a schematic diagram illustrating a timing sequence of the control signal depicted in FIG. 2 according to an embodiment of the present disclosure. The initialization mode PI depicted in FIG. 3 may be executed before entering the normal mode PN. In other embodiments, the initialization mode PI may be executed before each frame is activated. Referring to FIG. 2 and FIG. 3, when the driver circuit 100 operates in the initialization mode PI, the control voltage V3 turns off the isolating switch 120. During a charging period P1 of the initialization mode PI, control signals V5 and V7 turn on the first switch 221 and the third switch 223 respectively, and a control signal V6 turns off the second switch 222. Accordingly, during the charging period P1, the turned on first switch 221 and the turned on third switch 223 couple the first terminal and the second terminal of the capacitor 211 to the second terminal of the pull-down switch 131 and the third voltage (e.g., the system voltage Vdd) respectively. At this time, a potential difference between the system voltage Vdd and the second terminal of the pull-down switch 131 is stored in the capacitor 211.

During a discharging period P2 of the initialization mode PI, the control signals V6 and V7 turn on the second switch 222 and the third switch 223 respectively, and the control signal V5 turns off the first switch 221. Accordingly, during the discharging period P2, the turned on third switch 223 couples the first terminal of the capacitor 211 to the second terminal of the pull-down switch 131, and the turned on second switch 222 couples the second terminal of the capacitor 211 to the first terminal of the pull-down switch 131. At this time, the pull-down switch 131 is switched to a diode-connected transistor to discharge the capacitor 211. An electrical charge of the capacitor 211 is discharged to the grounding voltage Vss via the second switch 222 and the pull-down switch 131 until a gate-to-source voltage of the pull-down switch 131 is approximately equal to the threshold voltage Vth of the pull-down switch 131. Accordingly, the threshold voltage of the pull-down switch 131 may be stored in the capacitor 211. In other words, if a voltage of the control terminal 139 of the pull-down switch unit 130 is $V_{p2}$, a voltage of the control terminal of the pull-down switch 131 is $V_{c1}$ and a threshold voltage of the pull-down switch 131 is $V_{th1}$, a voltage difference between the two terminals of the capacitor 211 is $V_{c1}-V_{p2}=V_{th1}$.

When the driver circuit 100 operates in the normal mode PN, the control voltage V3 turns on the isolating switch 120. In this case, the pull-down switch 131 has a drain current $I_d=K(V_{c1}-V_{th1})^2=K[(V_{p2}+V_{th1})-V_{th1}]^2=K(V_{p2})^2$, in which K is a constant. Accordingly, the driver circuit 100 depicted in FIG. 2 is capable of improving/eliminating influences caused by device variation of the pull-down threshold voltage value $V_{th1}$ of the pull-down switch 131. In other words, the pull-down switch compensating circuit 132 depicted in FIG. 2 can sample the pull-down threshold voltage value $V_{th1}$ of the pull-down switch 131 in the initialization mode PI, and use the pull-down threshold voltage value $V_{th1}$ to compensate the input voltage of the pull-down switch unit 130 (the voltage $V_{c1}$ of the control terminal of the pull-down switch 131) in the normal mode PN.

Figure 4:
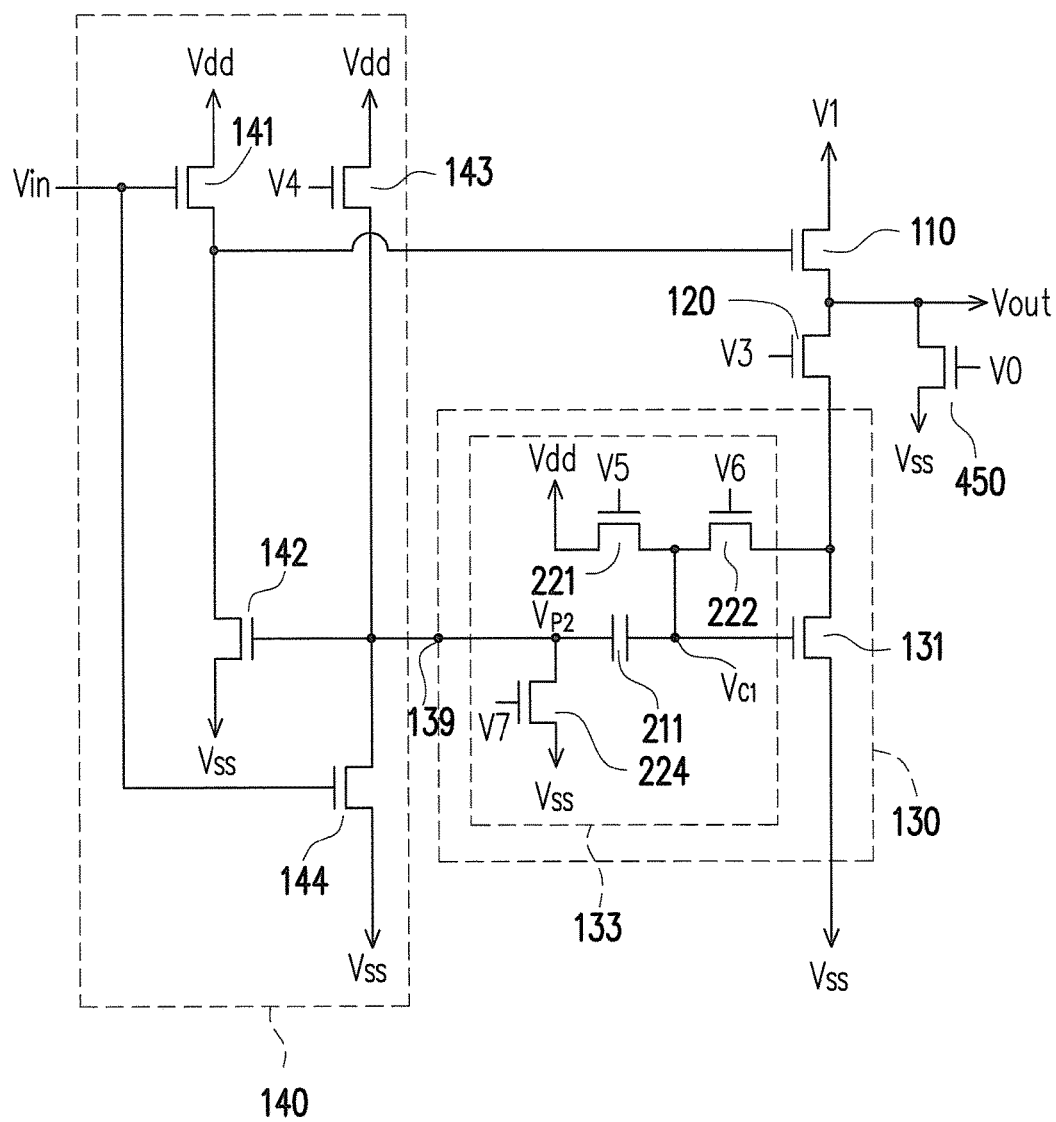
FIG. 4 is a block diagram illustrating circuitry of the driver circuit depicted in FIG. 1A according to another embodiment of the present disclosure.

Implementations of the driver circuit 100 of FIG. 1A shall not be limited by what illustrated in FIG. 2. For example, FIG. 4 is a block diagram illustrating circuitry of the driver circuit 100 depicted in FIG. 1A according to another embodiment of the present disclosure. The embodiment depicted in FIG. 4 may be inferred with reference to related description for FIG. 2 and FIG. 3. In the embodiment depicted in FIG. 4, the driver circuit 100 further includes an output pull-down switch 450. A first terminal of the output pull-down switch 450 is coupled to the output terminal Vout of the driver circuit 100. A second terminal of the output pull-down switch 450 is coupled to the second voltage (e.g., the second system voltage, such as the grounding voltage Vss or other fixed voltages). The output pull-down switch 450 is controlled by a control voltage V0. When the driver circuit 100 operates in the initialization mode PI, the output pull-down switch 450 is turned on to pull down a voltage of the output terminal Vout of the driver circuit 100 to the second voltage (e.g., the grounding voltage Vss). Accordingly, in the initialization mode PI, the output pull-down switch 450 can ensure that the voltage of the output terminal Vout of the driver circuit 100 is maintained at the low logic level. When the driver circuit 100 operates in the normal mode PN, the output pull-down switch 450 is turned off in order to prevent a normal operation of the driver circuit 100 from influences.

In the embodiment depicted in FIG. 4, the pull-down switch unit 130 includes a pull-down switch 131 and a pull-down switch compensating circuit 133. The pull-down compensating circuit 133 includes a capacitor 211, a first switch 221, a second switch 222 and a third switch 224. A first terminal and a second terminal of the capacitor 211 are coupled to the control terminal 139 of the pull-down switch unit 130 and the control terminal of the pull-down switch 131 respectively. A first terminal and a second terminal of the first switch 221 are coupled to the third voltage (e.g., the first system voltage, such as the system voltage Vdd or other fixed voltages) and the second terminal of the capacitor 211 respectively. A first terminal and a second terminal of the second switch 222 are coupled to the second terminal of the capacitor 211 and the first terminal of the pull-down switch 131 respectively. A first terminal and a second terminal of the third switch 224 are coupled to the first terminal of the capacitor 211 and a fourth voltage (e.g., the second system voltage, such as the grounding voltage Vss or other fixed voltages) respectively.

When the driver circuit 100 operates in the initialization mode PI, the control voltage V3 turns off the isolating switch 120. During a charging period P1 of the initialization mode PI, control signals V5 and V7 turn on the first switch 221 and the third switch 224 respectively, and a control signal V6 turns off the second switch 222. Accordingly, during the charging period P1, the turned on first switch 221 and the turned on third switch 224 couple the second terminal and the first terminal of the capacitor 211 to the third voltage (e.g., the system voltage Vdd) and the fourth voltage (e.g., the grounding voltage Vss) respectively. At this time, a potential difference between the system voltage Vdd and the grounding voltage Vss is stored in the capacitor 211.

During a discharging period P2 of the initialization mode PI, the control signals V6 and V7 turn on the second switch 222 and the third switch 224 respectively, and the control signal V5 turns off the first switch 221. Accordingly, during the discharging period P2, the turned on third switch 224 couples the first terminal of the capacitor 211 to the fourth voltage (e.g., the grounding voltage Vss), and the turned on second switch 222 couples the second terminal of the capacitor 211 to the first terminal of the pull-down switch 131. At this time, the pull-down switch 131 is switched to a diode-connected transistor to discharge the capacitor 211. Accordingly, the threshold voltage of the pull-down switch 131 may be stored in the capacitor 211. In other words, a voltage difference between the two terminals of the capacitor 211 is $V_{c1}-V_{p2}=V_{th1}$.

When the driver circuit 100 operates in the normal mode PN, the control voltage V3 turns on the isolating switch 120. In this case, the pull-down switch 131 has a drain current $I_d=K(V_{c1}-V_{th1})^2=K[(V_{p2}+V_{th1})-V_{th1}]^2=K(V_{p2})^2$, in which K is a constant. Accordingly, the driver circuit 100 depicted in FIG. 4 is capable of improving/eliminating influences caused by device variation of the pull-down threshold voltage value $V_{th1}$ of the pull-down switch 131.

Figure 5:
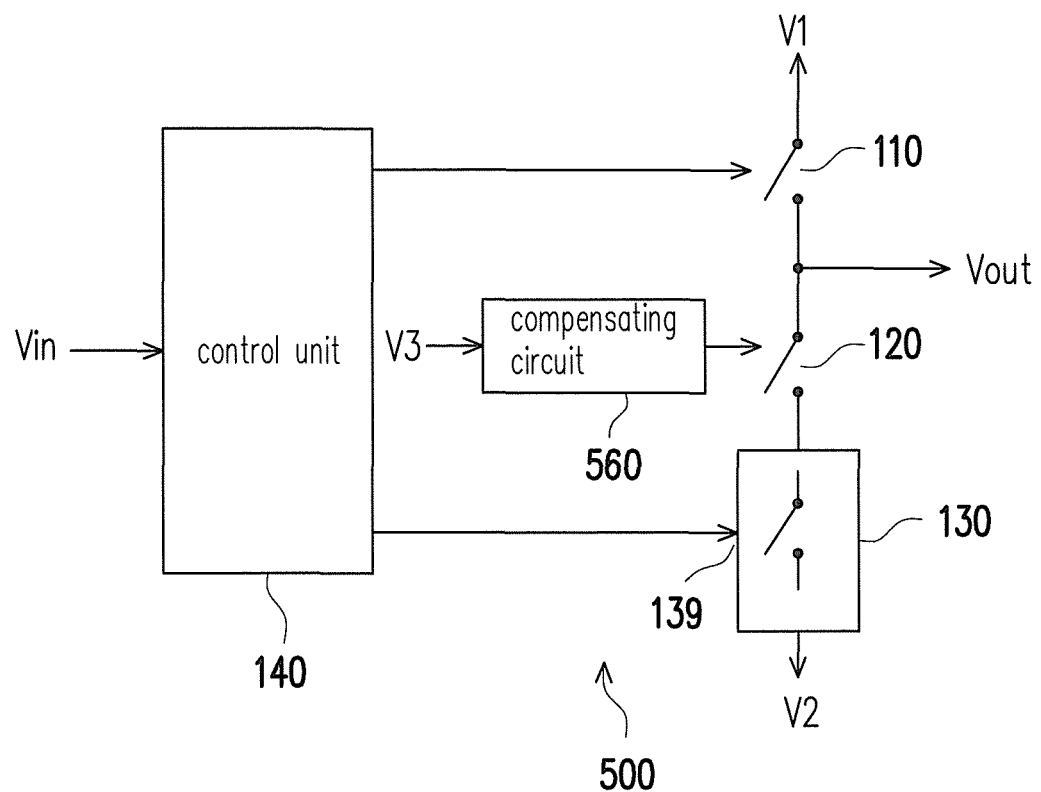
FIG. 5 is a block diagram illustrating circuitry of a driver circuit according to another embodiment of the present disclosure.

FIG. 5 is a block diagram illustrating circuitry of a driver circuit 500 according to another embodiment of the present disclosure. The driver circuit 500 includes a pull-up switch unit 110, an isolating switch 120, a pull-down switch unit 130, a control unit 140 and an isolating switch compensating circuit 560. The pull-up switch unit 110, the isolating switch 120, the pull-down switch unit 130 and the control unit 140 as depicted in FIG. 5 may refer to related descriptions for FIG. 1A to FIG. 4, which are not repeated hereinafter.

In the embodiment depicted in FIG. 5, the isolating switch compensating circuit 560 is coupled to a control terminal of the isolating switch 120. When the driver circuit 500 operates in the initialization mode, the isolating switch compensating circuit 560 can sample a threshold voltage of the isolating switch 120 to obtain an isolating threshold voltage value $V_{th2}$. When the driver circuit 500 operates in the normal mode, the isolating switch compensating circuit 560 can use the isolating threshold voltage value $V_{th2}$ to compensate an input voltage of the isolating switch 120. Accordingly, when the driver circuit 500 operates in the normal mode, besides that the pull-down switch unit 130 can use the pull-down threshold voltage value $V_{th1}$ to compensate the input voltage of the pull-down switch unit 130, the isolating switch compensating circuit 560 can also use the isolating threshold voltage value $V_{th2}$ to compensate the input voltage of the isolating switch 120.

Figure 6:
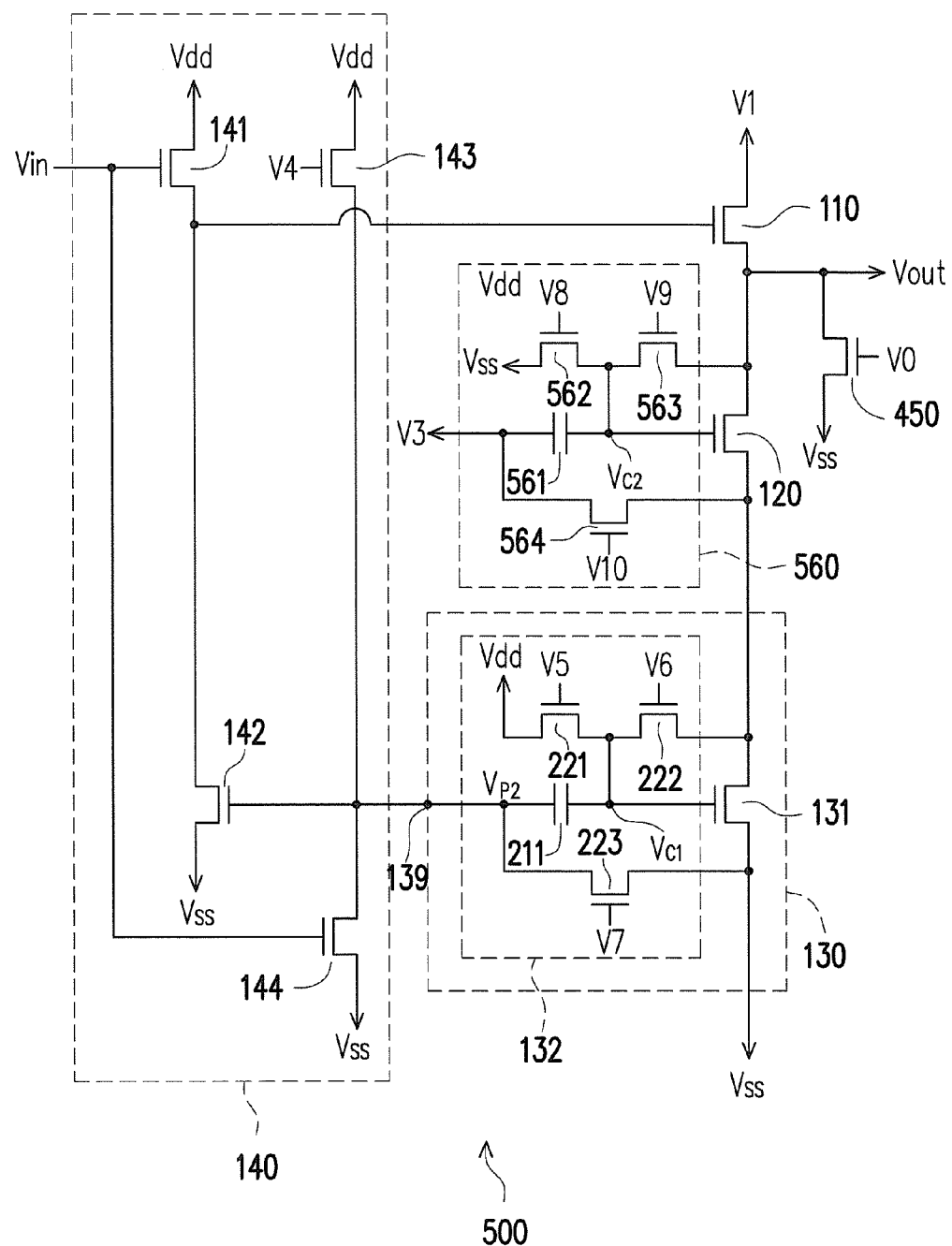
FIG. 6 is a block diagram illustrating circuitry of the driver circuit depicted in FIG. 5 according to an embodiment of the present disclosure.

FIG. 6 is a block diagram illustrating circuitry of the driver circuit 500 depicted in FIG. 5 according to an embodiment of the present disclosure. The driver circuit 500 depicted in FIG. 6 includes a pull-up switch unit 110, an isolating switch 120, a pull-down switch unit 130, a control unit 140, an output pull-down switch 450 and an isolating switch compensating circuit 560. The pull-down switch unit 130 and the control unit 140 may refer to related descriptions for FIG. 2 to FIG. 3, and the output pull-down switch 450 depicted in FIG. 6 may refer to related description for FIG. 4, which are not repeated hereinafter. In the embodiment depicted in FIG. 6, the pull-down switch unit 130 includes a pull-down switch 131 and a pull-down switch compensating circuit 132. In another embodiment, the pull-down switch compensating circuit 132 depicted in FIG. 6 may be replaced by the pull-down switch compensating circuit 133 depicted in FIG. 4.

In the embodiment depicted in FIG. 6, the isolating switch compensating circuit 560 includes a second capacitor 561, a first switch 562, a second switch 563 and a third switch 564. A first terminal and a second terminal of the second capacitor 561 are coupled to the control voltage V3 and the control terminal of the isolating switch 120 respectively. A first terminal and a second terminal of the first switch 562 are coupled to a first reference voltage (e.g., the second system voltage, such as the grounding voltage Vss or other fixed voltages) and the second terminal of the second capacitor 561 respectively. A first terminal and a second terminal of the second switch 563 are coupled to the second terminal of the second capacitor 561 and the first terminal of the isolating switch 120 respectively. A first terminal and a second terminal of the third switch 564 are coupled to the first terminal of the second capacitor 561 and the second terminal of the isolating switch 120 respectively.

Figure 7:
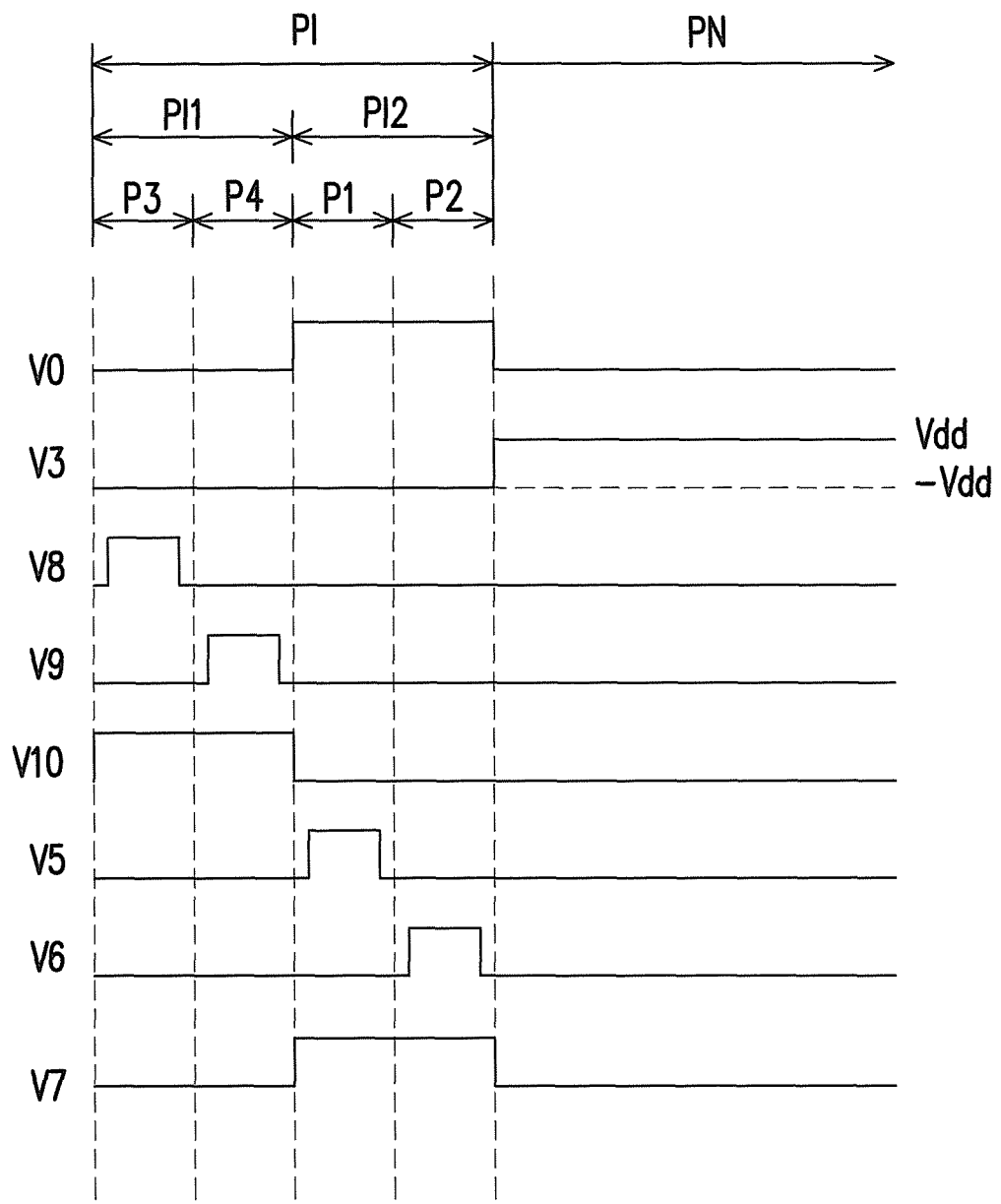
FIG. 7 is a schematic diagram illustrating a timing sequence of the control signal depicted in FIG. 6 according to an embodiment of the present disclosure.

FIG. 7 is a schematic diagram illustrating a timing sequence of the control signal depicted in FIG. 6 according to an embodiment of the present disclosure. The initialization mode PI depicted in FIG. 7 may be executed before entering the normal mode PN. In other embodiments, the initialization mode PI may be executed before each frame is activated. The embodiment depicted in FIG. 7 may be inferred with reference to related description for FIG. 3. Referring to FIG. 6 and FIG. 7, when the driver circuit 500 operates during a first period PI1 of the initialization mode PI, the isolating switch compensating circuit 560 can sample a threshold voltage of the isolating switch 120 to obtain an isolating threshold voltage value $V_{th2}$. When the driver circuit 500 operates during a second period PI2 of the initialization mode PI, the pull-down switch compensating circuit 132 can sample a threshold voltage of the pull-down switch 131 to obtain a pull-down threshold voltage value $V_{th1}$. When the driver circuit 500 operates in a normal mode PI, the pull-down switch compensating circuit 132 can use the pull-down threshold voltage value $V_{th1}$ to compensate an input voltage of the pull-down switch 131, and the isolating switch compensating circuit 560 can use the isolating threshold voltage value $V_{th2}$ to compensate the input voltage of the isolating switch 120. Operation detail regarding the second period PI2 of the initialization mode PI and the normal mode PN may refer to related descriptions of the initialization mode PI and the normal mode PN for FIG. 2 to FIG. 4, which are not repeated hereinafter.

Referring to FIG. 6 and FIG. 7, during a charging period P3 of the first period PI1 of the initialization mode PI, control signals V8 and V10 turn on the first switch 562 and the third switch 564 respectively, and a control signal V9 turns off the second switch 563. Accordingly, during the charging period P3, the turned on first switch 562 and the turned on third switch 564 couple the second terminal and the first terminal of the second capacitor 561 to the first reference voltage (e.g., the second system voltage, such as the grounding voltage Vss or other fixed voltages) and a second reference voltage (e.g., a negative system voltage −Vdd provided by the control voltage V3) respectively. At this time, a potential difference between the grounding voltage Vss and the negative system voltage −Vdd is stored in the second capacitor 561.

During a discharging period P4 of the first period PI1 of the initialization mode PI, the control signals V9 and V10 turn on the second switch 563 and the third switch 564 respectively, and the control signal V8 turns off the first switch 562. Accordingly, during the discharging period P4, the turned on third switch 564 can couple the first terminal of the second capacitor 561 to the second terminal of the isolating switch 120, and the turned on second switch 563 can couple the second terminal of the second capacitor 561 to the first terminal of the isolating switch 120. At this time, the isolating switch 120 is switched to a diode-connected transistor to discharge the second capacitor 561. An electrical charge of the second capacitor 561 is discharged to the negative system voltage −Vdd via the second switch 563 and the isolating switch 120 until a gate-to-source voltage of the isolating switch 120 is approximately equal to the threshold voltage $V_{th2}$ of the isolating switch 120. Accordingly, the isolating threshold voltage value $V_{th2}$ of the isolating switch 120 may be stored in the second capacitor 561. In other words, if a voltage of the control terminal of the pull-down switch 131 is $V_{c2}$, a voltage difference between the two terminals of the second capacitor 561 is $V_{c2}-V3=V_{th2}$.

When the driver circuit 500 operates in the normal mode PN, the control voltage V3 turns on the isolating switch 120. The isolating switch 120 has a drain current $I_d = K(V_{c2}-V_{th2})^2 = K[(V3+V_{th2})-V_{th2}]^2 = K(V3)^2$, in which K is a constant. Accordingly, the driver circuit 500 depicted in FIG. 6 is capable of improving/eliminating influences caused by device variation of the isolating threshold voltage value $V_{th2}$ of the isolating switch 120. In addition, the pull-down switch 131 has a drain current $I_d = K(V_{c1}-V_{th1})^2 = K[(V_{p2}+V_{th1})-V_{th1}]^2 = K(V_{p2})^2$, in which K is a constant. Accordingly, the driver circuit 100 depicted in FIG. 6 is capable of improving/eliminating influences caused by device variation of the pull-down threshold voltage value $V_{th1}$ of the pull-down switch 131. In other words, the isolating switch compensating circuit 560 and the pull-down compensating circuit 132 as depicted in FIG. 6 can sample the isolating threshold voltage value $V_{th2}$ of the isolating switch 120 and the pull-down threshold voltage value $V_{th1}$ of the pull-down switch 131 respectively during the initialization mode PI, and use the isolating threshold voltage value $V_{th2}$ and the pull-down threshold voltage value $V_{th1}$ to compensate the input voltage of the isolating switch 120 and the input voltage of the pull-down switch unit 130 respectively during the normal mode PN.

Figure 8:
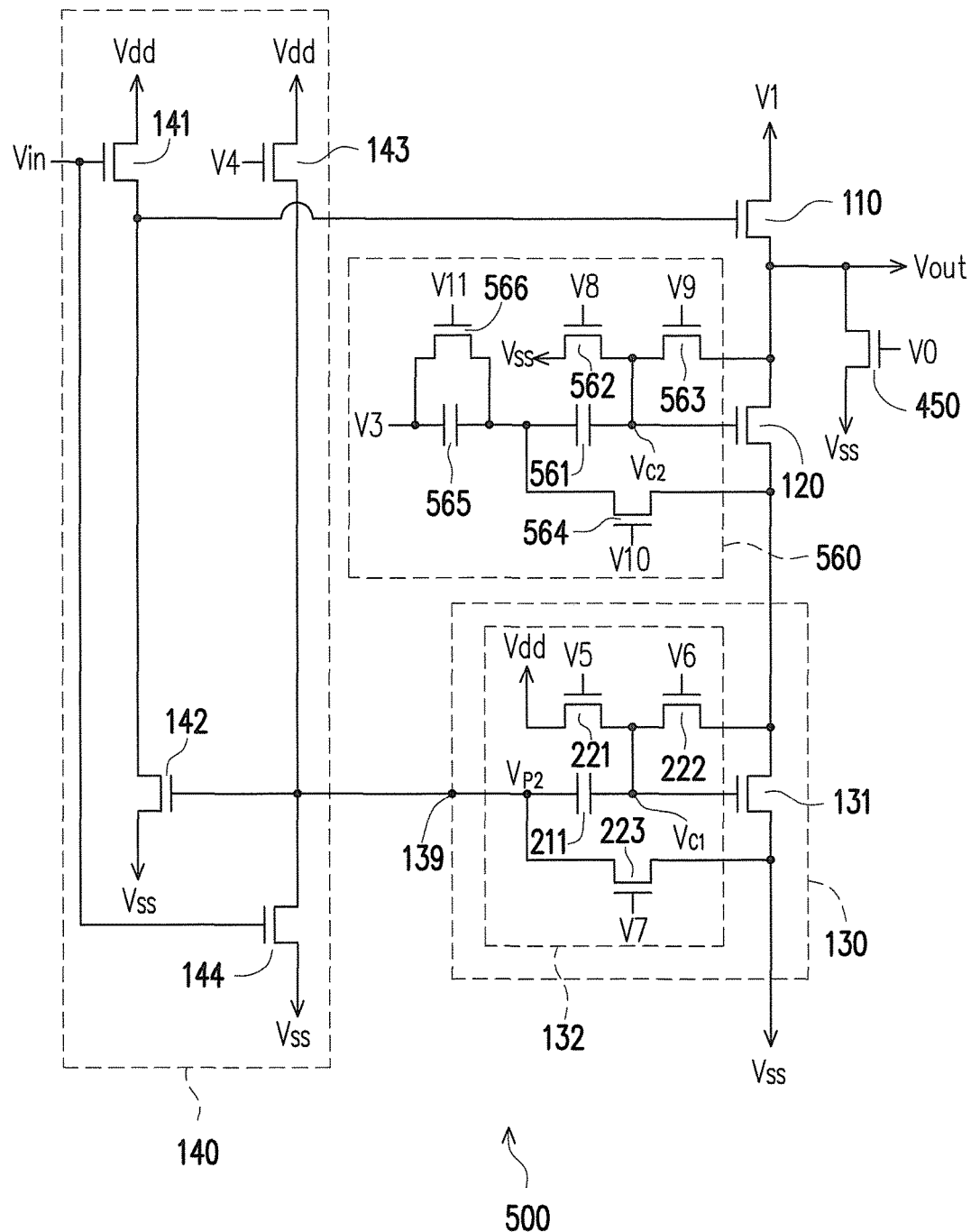
FIG. 8 is a block diagram illustrating circuitry of the driver circuit depicted in FIG. 5 according to another embodiment of the present disclosure.

Implementations of the driver circuit 500 of FIG. 5 shall not be limited by what illustrated in FIG. 6. For example, FIG. 8 is a block diagram illustrating circuitry of the driver circuit 500 depicted in FIG. 5 according to another embodiment of the present disclosure. The embodiment depicted in FIG. 8 may be inferred with reference to related description for FIG. 6 and FIG. 7. In the embodiment depicted in FIG. 8, the isolating switch compensating circuit 560 includes a first capacitor 565, a second capacitor 561, a first switch 562, a second switch 563, a third switch 564 and a fourth switch 566. A first terminal of the first capacitor 565 is coupled to the control voltage V3. A first terminal and a second terminal of the second capacitor 561 are coupled to a second terminal of the first capacitor 565 and the control terminal of the isolating switch 120 respectively. A first terminal and a second terminal of the first switch 562 are coupled to a reference voltage (e.g., the second system voltage, such as the grounding voltage Vss or other fixed voltages) and the second terminal of the second capacitor 561 respectively. A first terminal and a second terminal of the second switch 563 are coupled to the second terminal of the second capacitor 561 and the first terminal of the isolating switch 120 respectively. A first terminal and a second terminal of the third switch 564 are coupled to the first terminal of the second capacitor 561 and the second terminal of the isolating switch 120 respectively. A first terminal and a second terminal of the fourth switch 566 are coupled to the first terminal and the second terminal of the first capacitor 565 respectively.

Figure 9:
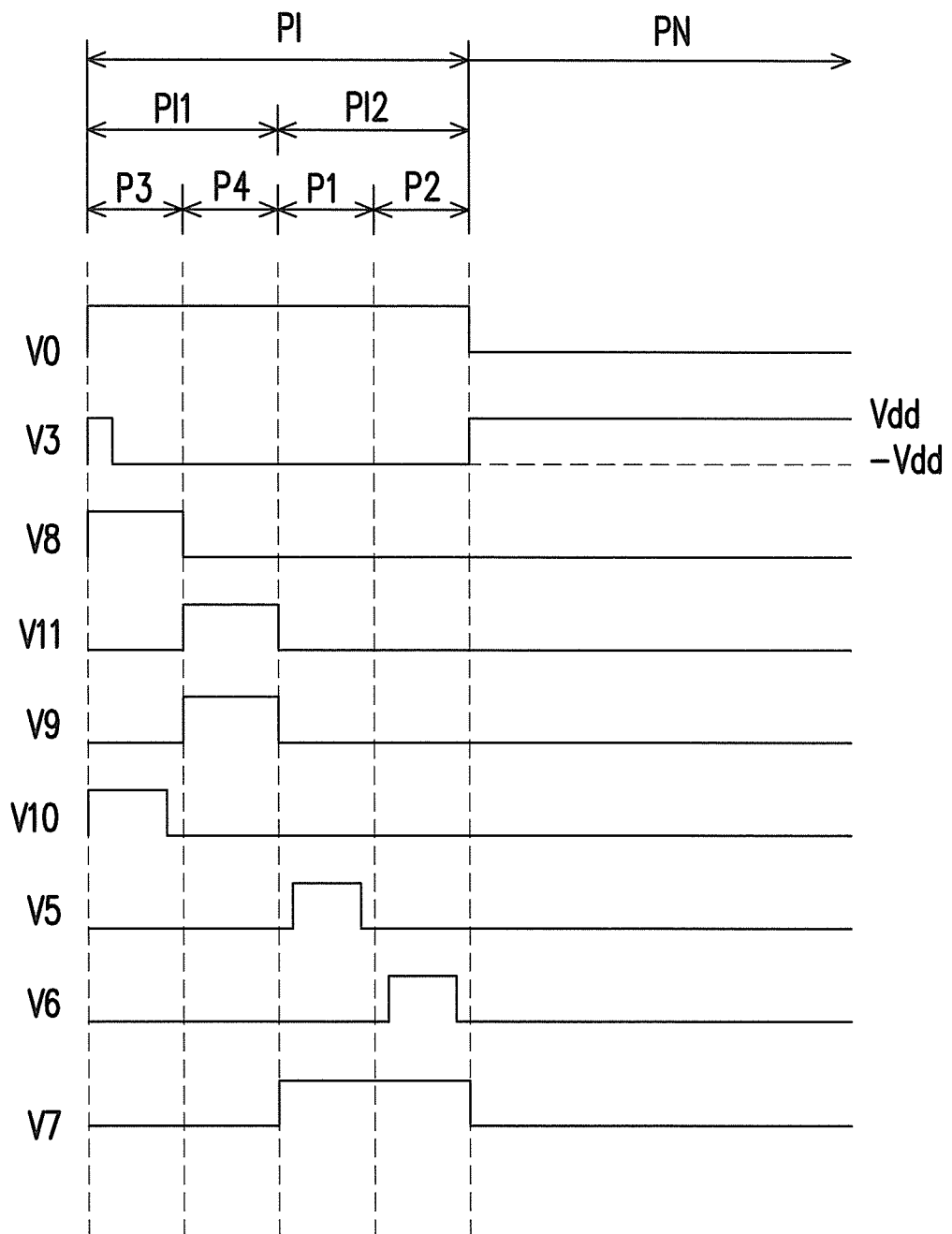
FIG. 9 is a schematic diagram illustrating a timing sequence of the control signal depicted in FIG. 8 according to an embodiment of the present disclosure.

FIG. 9 is a schematic diagram illustrating a timing sequence of the control signal depicted in FIG. 8 according to an embodiment of the present disclosure. The embodiment depicted in FIG. 9 may refer to related description for FIG. 7, which is not repeated hereinafter. Referring to FIG. 8 and FIG. 9, during the charging period P3 of the first period PI1 of the initialization mode PI, a control signal V11 turns off the fourth switch 566. During the discharging period P4 of the first period PI1 of the initialization mode PI, the control signal V11 turns on the fourth switch 566. Accordingly, the negative system voltage −Vdd provided by the control voltage V3 may be transmitted to the first terminal of the second capacitor 561. During the charging period P3, the second terminal and the first terminal of the second capacitor 561 are coupled to the first reference voltage (e.g., the second system voltage, such as the grounding voltage Vss or other fixed voltages) and the second reference voltage (e.g., the negative system voltage −Vdd) respectively. During the discharging period P4, the first terminal of the second capacitor 561 is coupled to the second terminal of the isolating switch 120, and the second terminal of the second capacitor 561 is coupled to the first terminal of the isolating switch 120 (which is the second system voltage at the time, such as the fixed voltage greater than 0V, the grounding voltage Vss or a negative fixed voltage) and the control terminal of the isolating switch 120. After the discharging period P4 ends, a voltage difference between the two terminals of the second capacitor 561 is $V_{c2}-V3=V_{th2}$. When the driver circuit 500 operates in the normal mode PN, the isolating switch 120 has a drain current $I_d=K(V_{c2}-V_{th2})^2=K[(V3+V_{th2})-V_{th2}]^2=K(V3)^2$, in which K is a constant. Accordingly, the driver circuit 500 depicted in FIG. 8 is capable of improving/eliminating influences caused by device variation of the isolating threshold voltage value $V_{th2}$ of the isolating switch 120.

Figure 10:
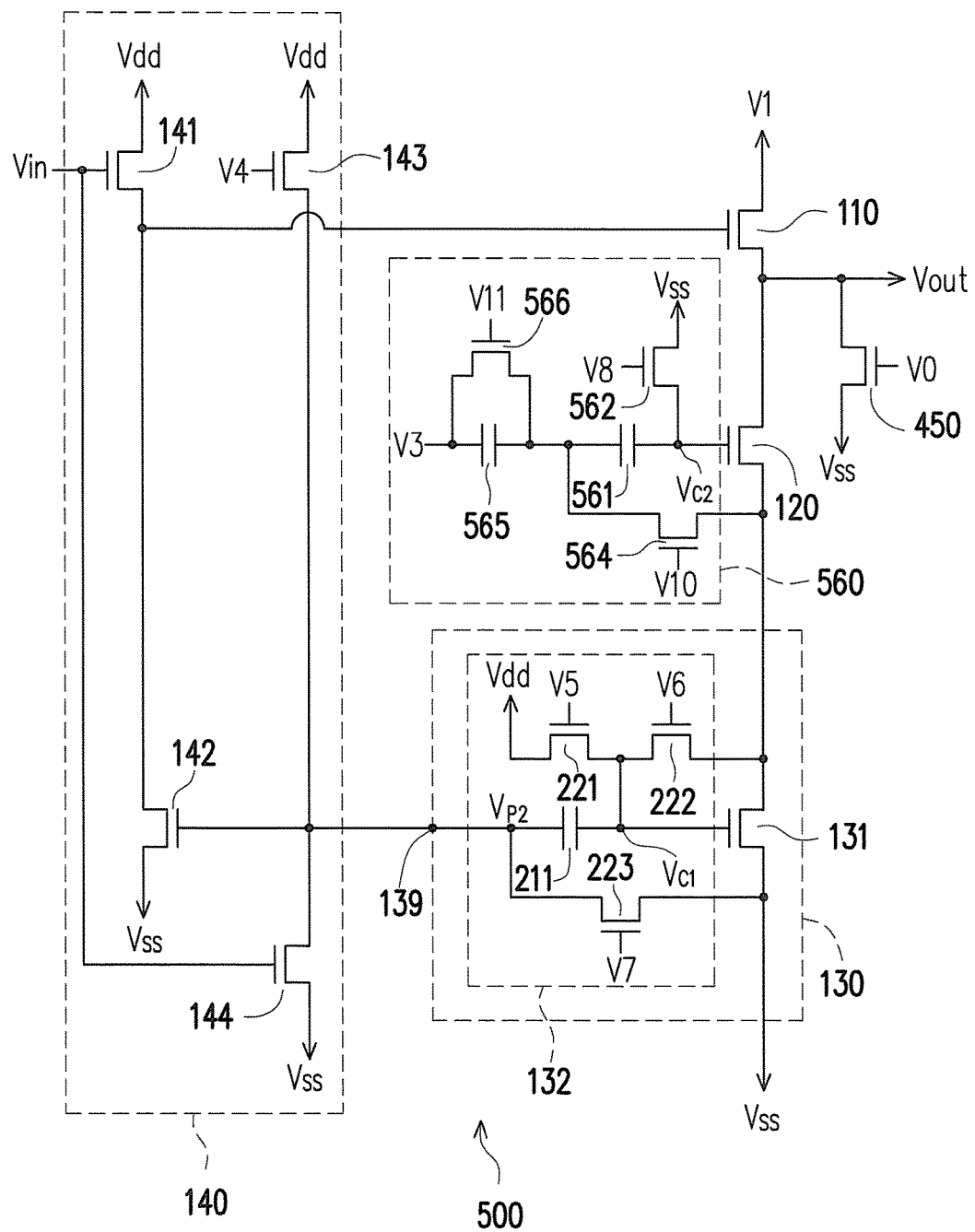
FIG. 10 is a block diagram illustrating circuitry of the driver circuit depicted in FIG. 5 according to yet another embodiment of the present disclosure.

FIG. 10 is a block diagram illustrating circuitry of the driver circuit 500 depicted in FIG. 5 according to yet another embodiment of the present disclosure. In the embodiment depicted in FIG. 10, the isolating switch compensating circuit 560 includes a first capacitor 565, a second capacitor 561, a first switch 562, a third switch 564 and a fourth switch 566. The embodiment depicted in FIG. 10 may refer to related descriptions for FIG. 8 and FIG. 9, which are not repeated hereinafter. Unlike the embodiment depicted in FIG. 8, the second switch 563 depicted in FIG. 8 is omitted in the embodiment depicted in FIG. 10.

Referring to FIG. 9 and FIG. 10, in the previous operations, the fourth switch 566 used to short circuit the two terminals of the first capacitor 565 so that a voltage difference between the two terminals of the first capacitor 565 is 0. During the charging period P3 of the first period PI1 of the initialization mode PI, the control signal V11 turns off the fourth switch 566, and the control signals V8 and V10 turn on the first switch 562 and the third switch 564, so as to pull down the control signal V3 to the negative system voltage −Vdd. The negative system voltage −Vdd is applied on the first terminal of the second capacitor 561 via the first capacitor 565. The grounding voltage Vss is applied on the second terminal of the second capacitor 561 via the first switch 562. Accordingly, the second capacitor 561 is charged, so that the voltage difference between the two terminals of the first capacitor 565 is approximately Vdd. At this time, because the gate-to-source voltage (a voltage difference between a gate and a source) is greater than the isolating threshold voltage value $V_{th2}$ of the isolating switch 120, the isolating switch 120 is then turned on. Because the third switch 564, the isolating switch 120 and the output pull-down switch 450 are turned on; the second capacitor 561 is discharged to reduce the voltage difference between the two terminals of the second capacitor 561. That is to say, the gate-to-source voltage of the isolating switch 120 is reduced. When the gate-to-source voltage of the isolating switch 120 is not greater than the isolating threshold voltage value $V_{th2}$, the isolating switch 120 is turned off, so as to stop discharging the second capacitor 561. At this point, the isolating threshold voltage value $V_{th2}$ of the isolating switch 120 is sampled/stored in the second capacitor 561.

During the discharging period P4 of the first period PI1 of the initialization mode PI, the control signals V8 and V10 turn off the first switch 562 and the third switch 564, so as to store the isolating threshold voltage value $V_{th2}$ in the second capacitor 561. The control signal V11 turns on the fourth switch 566, such that the voltage difference between the two terminals of the first capacitor 565 is reset to 0. After the discharging period P4 ends, the voltage difference between the two terminals of the second capacitor 561 is $V_{th2}$. When the driver circuit 500 operates in the normal mode PN, the isolating switch 120 has a drain current $I_d=K(V_{c2}-V_{th2})^2=K[(V3+V_{th2})-V_{th2}]^2=K(V3)^2$, in which K is a constant. Accordingly, the driver circuit 500 depicted in FIG. 10 is capable of improving/eliminating influences caused by device variation of the isolating threshold voltage value $V_{th2}$ of the isolating switch 120.

In summary, according to the driver circuit and the operation method thereof as described in the foregoing embodiments, the pull-down switch unit 130 may be utilized to sample the threshold voltage of the pull-down switch 131 therein. When the driver circuit operates in the normal mode, the pull-down switch unit 130 can compensate the input voltage of the pull-down switch unit 130 according to the sampled pull-down threshold voltage value. Therefore, the driver circuit and the operation method as described in the embodiments of the present disclosure are capable of compensating the device variation of the threshold voltage.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

It will be apparent to those skilled in the art that various modifications and variations can be made to the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A driver circuit, comprising:
a pull-up switch unit, having a first terminal coupled to a first voltage, and a second terminal of the pull-up switch unit being coupled to an output terminal of the driver circuit;
an isolating switch, having a first terminal coupled to the second terminal of the pull-up switch unit;
a pull-down switch unit, having a first terminal coupled to a second terminal of the isolating switch, and a second terminal of the pull-down switch unit being coupled to a second voltage; wherein when the driver circuit operates in an initialization mode, the isolating switch is turned off, and the pull-down switch unit samples a threshold voltage of the pull-down switch unit to obtain a pull-down threshold voltage value; and when the driver circuit operates in a normal mode, the isolating switch is turned on, and the pull-down switch unit uses the pull-down threshold voltage value to compensate an input voltage of the pull-down switch unit; and
a control unit, having an input terminal coupled to an input terminal of the driver circuit, and a first output terminal and a second output terminal of the control unit being coupled to a control terminal of the pull-up switch unit and a control terminal of the pull-down switch unit respectively.
2. The driver circuit according to claim 1, wherein the pull-down switch unit comprises:

a pull-down switch, having a first terminal coupled to the second terminal of the isolating switch, and a second terminal of the pull-down switch being coupled to the second voltage; and a pull-down switch compensating circuit, coupled between a control terminal of the pull-down switch unit and a control terminal of the pull-down switch, wherein when the driver circuit operates in the initialization mode, the pull-down switch compensating circuit samples a threshold voltage of the pull-down switch to obtain the pull-down threshold voltage value; and when the driver circuit operates in the normal mode, the pull-down switch compensating circuit uses the pull-down threshold voltage value to compensate an input voltage of the pull-down switch.

3. The driver circuit according to claim 2, wherein the pull-down switch compensating circuit comprises:

a capacitor, having a first terminal and a second terminal coupled to the control terminal of the pull-down switch unit and the control terminal of the pull-down switch respectively;

a first switch, having a first terminal and a second terminal coupled to a third voltage and the second terminal of the capacitor respectively, wherein the third voltage is a first system voltage;

a second switch, having a first terminal and a second terminal coupled to the second terminal of the capacitor and the first terminal of the pull-down switch respectively; and a third switch, having a first terminal and a second terminal coupled to the first terminal of the capacitor and the second terminal of the pull-down switch respectively.

4. The driver circuit according to claim 2, wherein the pull-down switch compensating circuit comprises:

a capacitor, having a first terminal and a second terminal coupled to the control terminal of the pull-down switch unit and the control terminal of the pull-down switch respectively;

a first switch, having a first terminal and a second terminal coupled to a third voltage and the second terminal of the capacitor respectively;

a second switch, having a first terminal and a second terminal coupled to the second terminal of the capacitor and the first terminal of the pull-down switch respectively; and a third switch, having a first terminal and a second terminal coupled to the first terminal of the capacitor and a fourth voltage respectively, wherein the third voltage is a first system voltage, and the fourth voltage is a second system voltage.

5. The driver circuit according to claim 1, further comprising:

an isolating switch compensating circuit, coupled to a control terminal of the isolating switch, wherein when the driver circuit operates in the initialization mode, the isolating switch compensating circuit samples a threshold voltage of the isolating switch to obtain an isolating threshold voltage value; and when the driver circuit operates in the normal mode, the isolating switch compensating circuit uses the isolating threshold voltage value to compensate an input voltage of the isolating switch.

6. The driver circuit according to claim 5, wherein the isolating switch compensating circuit comprises:

a capacitor, having a first terminal and a second terminal coupled to a control voltage and the control terminal of the isolating switch respectively;

a first switch, having a first terminal and a second terminal coupled to a reference voltage and the second terminal of the capacitor respectively, wherein the reference voltage is a second system voltage;

a second switch, having a first terminal and a second terminal coupled to the second terminal of the capacitor and the first terminal of the isolating switch respectively; and a third switch, having a first terminal and a second terminal coupled to the first terminal of the capacitor and the second terminal of the isolating switch respectively.

7. The driver circuit according to claim 5, wherein the isolating switch compensating circuit comprises:

a first capacitor, having a first terminal coupled to a control voltage;

a second capacitor, having a first terminal and a second terminal coupled to a second terminal of the first capacitor and the control terminal of the isolating switch respectively;

a first switch, having a first terminal and a second terminal coupled to a reference voltage and the second terminal of the second capacitor respectively;

a second switch, having a first terminal and a second terminal coupled to the second terminal of the second capacitor and the first terminal of the isolating switch respectively;

a third switch, having a first terminal and a second terminal coupled to the first terminal of the second capacitor and the second terminal of the isolating switch respectively; and a fourth switch, having a first terminal and a second terminal coupled to the first terminal and the second terminal of the first capacitor respectively.

8. The driver circuit according to claim 5, wherein the isolating switch compensating circuit comprises:

a first capacitor, having a first terminal coupled to a control voltage;

a second capacitor, having a first terminal and a second terminal coupled to a second terminal of the first capacitor and the control terminal of the isolating switch respectively;

a first switch, having a first terminal and a second terminal coupled to a reference voltage and the second terminal of the second capacitor respectively;

a second switch, having a first terminal and a second terminal coupled to the first terminal of the second capacitor and the second terminal of the isolating switch respectively; and a third switch, having a first terminal and a second terminal coupled to the first terminal and the second terminal of the first capacitor respectively.

9. The driver circuit according to claim 1, further comprising:

an output pull-down switch, having a first terminal coupled to the output terminal of the driver circuit, and a second terminal of the output pull-down switch being coupled to the second voltage.

10. The driver circuit according to claim 1, wherein the control unit comprises:

a first transistor, having a first terminal coupled to a third voltage, a second terminal of the first transistor being coupled to the control terminal of the pull-up switch unit, and a control terminal of the first transistor being coupled to the input terminal of the driver circuit;

a second transistor, having a first terminal coupled to the second terminal of the first transistor, a second terminal of the second transistor being coupled to the second voltage, and a control terminal of the second transistor being coupled to the control terminal of the pull-down switch unit;

a third transistor, having a first terminal coupled to the third voltage, and a second terminal of the third transistor being coupled to the control terminal of the second transistor; and a fourth transistor, having a first terminal coupled to the second terminal of the third transistor, a second terminal of the fourth transistor being coupled to the second voltage, and a control terminal of the fourth transistor being coupled to the input terminal of the driver circuit.

11. An operation method of a driver circuit, the driver circuit comprising a pull-up switch unit, an isolating switch and a pull-down switch unit, a first terminal and a second terminal of the pull-up switch unit being coupled to a first voltage and an output terminal of the driver circuit respectively, the first voltage being a first system voltage, a first terminal of the isolating switch being coupled to the second terminal of the pull-up switch unit, a first terminal and a second terminal of the pull-down switch unit being coupled to a second terminal of the isolating switch and a second voltage respectively, the second voltage being a second system voltage, the pull-down switch unit comprises a pull-down switch and a capacitor, a first terminal of the pull-down switch is coupled to the second terminal of the isolating switch, a second terminal of the pull-down switch is coupled to the second voltage, a first terminal and a second terminal of the capacitor are coupled to a control terminal of the pull-down switch unit and a control terminal of the pull-down switch respectively, and the operation method comprising:

turning off the isolating switch when the driver circuit operates in an initialization mode;

sampling a threshold voltage of the pull-down switch of the pull-down switch unit to obtain a pull-down threshold voltage value when the driver circuit operates in the initialization mode;

turning on the isolating switch when the driver circuit operates in a normal mode; and using the pull-down threshold voltage value to compensate an input voltage of the pull-down switch of the pull-down switch unit when the driver circuit operates in the normal mode, wherein the step of sampling the threshold voltage of the pull-down switch comprises:

during a charging period of the initialization mode, coupling the first terminal and the second terminal of the capacitor to the second terminal of the pull-down switch and a third voltage respectively, wherein the third voltage is the first system voltage; and during a discharging period of the initialization mode, coupling the first terminal of the capacitor to the second terminal of the pull-down switch, and coupling the second terminal of the capacitor to the first terminal and the control terminal of the pull-down switch.

12. The operation method of the driver circuit according to claim 11, further comprising:

sampling a threshold voltage of the isolating switch to obtain an isolating threshold voltage value when the driver circuit operates in the initialization mode; and using the isolating threshold voltage value to compensate an input voltage of the isolating switch when the driver circuit operates in the normal mode.

13. The operation method of the driver circuit according to claim 12, wherein the driver circuit further comprises a capacitor, a first terminal and a second terminal of the capacitor are coupled to a control voltage and a control terminal of the isolating switch respectively, and the step of sampling the threshold voltage of the isolating switch comprises:

during a charging period of the initialization mode, coupling the second terminal and the first terminal of the capacitor to a first reference voltage and a second reference voltage respectively, wherein the first reference voltage is the second system voltage, and the second reference voltage is a negative system voltage; and during a discharging period of the initialization mode, coupling the first terminal of the capacitor to the second terminal of the isolating switch, and coupling the second terminal of the capacitor to the first terminal and the control terminal of the isolating switch.

14. The operation method of the driver circuit according to claim 12, wherein the driver circuit further comprises a capacitor, a first terminal and a second terminal of the capacitor are coupled to a control voltage and a control terminal of the isolating switch respectively, and the step of sampling the threshold voltage of the isolating switch comprises:

during a charging period of the initialization mode, coupling the second terminal and the first terminal of the capacitor to a first reference voltage and a second reference voltage respectively; and during a discharging period of the initialization mode, coupling the first terminal of the capacitor to the second terminal of the isolating switch, and coupling the second terminal of the capacitor to the first reference voltage and the control terminal of the isolating switch.

15. The operation method of the driver circuit according to claim 11, further comprising:

when the driver circuit operates in the initialization mode, pulling down a voltage of the output terminal of the driver circuit to the second voltage.

16. An operation method of a driver circuit, the driver circuit comprising a pull-up switch unit, an isolating switch and a pull-down switch unit, a first terminal and a second terminal of the pull-up switch unit being coupled to a first voltage and an output terminal of the driver circuit respectively, the first voltage being a first system voltage, a first terminal of the isolating switch being coupled to the second terminal of the pull-up switch unit, a first terminal and a second terminal of the pull-down switch unit being coupled to a second terminal of the isolating switch and a second voltage respectively, the second voltage being a second system voltage, the pull-down switch unit comprises a pull-down switch and a capacitor, a first terminal of the pull-down switch is coupled to the second terminal of the isolating switch, a second terminal of the pull-down switch is coupled to the second voltage, a first terminal and a second terminal of the capacitor are coupled to a control terminal of the pull-down switch unit and a control terminal of the pull-down switch respectively, and the operation method comprising:

turning off the isolating switch when the driver circuit operates in an initialization mode;

sampling a threshold voltage of the pull-down switch of the pull-down switch unit to obtain a pull-down threshold voltage value when the driver circuit operates in the initialization mode;

turning on the isolating switch when the driver circuit operates in a normal mode; and using the pull-down threshold voltage value to compensate an input voltage of the pull-down switch of the pull-down switch unit when the driver circuit operates in the normal mode, wherein the step of sampling the threshold voltage of the pull-down switch comprises:

during a charging period of the initialization mode, coupling the second terminal and the first terminal of the capacitor to a third voltage and a fourth voltage respectively, wherein the third voltage is the first system voltage, and the fourth voltage is the second system voltage; and during a discharging period of the initialization mode, coupling the first terminal of the capacitor to the fourth voltage, and coupling the second terminal of the capacitor to the first terminal and the control terminal of the pull-down switch.

17. The operation method of the driver circuit according to claim 16, further comprising:

sampling a threshold voltage of the isolating switch to obtain an isolating threshold voltage value when the driver circuit operates in the initialization mode; and using the isolating threshold voltage value to compensate an input voltage of the isolating switch when the driver circuit operates in the normal mode.

18. The operation method of the driver circuit according to claim 17, wherein the driver circuit further comprises a capacitor, a first terminal and a second terminal of the capacitor are coupled to a control voltage and a control terminal of the isolating switch respectively, and the step of sampling the threshold voltage of the isolating switch comprises:

during a charging period of the initialization mode, coupling the second terminal and the first terminal of the capacitor to a first reference voltage and a second reference voltage respectively, wherein the first reference voltage is the second system voltage, and the second reference voltage is a negative system voltage; and during a discharging period of the initialization mode, coupling the first terminal of the capacitor to the second terminal of the isolating switch, and coupling the second terminal of the capacitor to the first terminal and the control terminal of the isolating switch.

19. The operation method of the driver circuit according to claim 17, wherein the driver circuit further comprises a capacitor, a first terminal and a second terminal of the capacitor are coupled to a control voltage and a control terminal of the isolating switch respectively, and the step of sampling the threshold voltage of the isolating switch comprises:

during a charging period of the initialization mode, coupling the second terminal and the first terminal of the capacitor to a first reference voltage and a second reference voltage respectively; and during a discharging period of the initialization mode, coupling the first terminal of the capacitor to the second terminal of the isolating switch, and coupling the second terminal of the capacitor to the first reference voltage and the control terminal of the isolating switch.

20. The operation method of the driver circuit according to claim 16, further comprising:

when the driver circuit operates in the initialization mode, pulling down a voltage of the output terminal of the driver circuit to the second voltage.

* * * * *